US007252524B1

(12) United States Patent
Johnson, Jr. et al.

(10) Patent No.: US 7,252,524 B1
(45) Date of Patent: Aug. 7, 2007

(54) POWER INTERCONNECT ASSEMBLIES AND METHODS FOR CONFIGURING THE SAME

(75) Inventors: Robert W. Johnson, Jr., Raleigh, NC (US); Lennart Rune Jonsson, Raleigh, NC (US)

(73) Assignee: Eaton Power Quality Corporation, Cleveland, OH (US)

( * ) Notice: Subject to any disclaimer, the term of this patent is extended or adjusted under 35 U.S.C. 154(b) by 0 days.

(21) Appl. No.: 11/378,139

(22) Filed: Mar. 17, 2006

(51) Int. Cl.
*H01R 4/60* (2006.01)
(52) U.S. Cl. .................. 439/210; 439/114; 439/118
(58) Field of Classification Search ............... 439/114, 439/209–210, 212, 118
See application file for complete search history.

(56) References Cited

U.S. PATENT DOCUMENTS

| | | | |
|---|---|---|---|
| 3,922,053 A | * 11/1975 | Hafer | 439/114 |
| 4,376,561 A | * 3/1983 | Vanden Hoek et al. | 439/210 |
| 4,678,253 A | * 7/1987 | Hicks et al. | 439/210 |
| 4,897,048 A | * 1/1990 | Liebon et al. | 439/211 |
| 6,967,283 B2 | 11/2005 | Rasmussen et al. | |
| 7,094,077 B1 | * 8/2006 | Chen | 439/118 |

FOREIGN PATENT DOCUMENTS

GB    2067363    * 12/1980

* cited by examiner

*Primary Examiner*—Michael C. Zarroli
(74) *Attorney, Agent, or Firm*—Myers Bigel Sibley & Sajovec PA

(57) ABSTRACT

Power interconnect assemblies include a longitudinally extending base member including a plurality of longitudinally extending bus bar receiving channels configured to receive longitudinally extending bus bars. An interconnect module is configured to be coupled to the base member. The interconnect module is configured to receive a connector member that is configured to receive a pluggable connectorized cable from a power component. The base member is configured so that ones of a plurality of electrical connectors of the connector member may be coupled to corresponding ones of the bus bars with the bus bars inserted in the channels.

36 Claims, 14 Drawing Sheets

POWER INTERCONNECT ASSEMBLIES AND METHODS FOR CONFIGURING THE SAME

BACKGROUND OF THE INVENTION

The present invention relates to interconnect assemblies and, more particularly, to power interconnect assemblies and methods of using the same.

Internet server farms and other large-scale data processing installations often include a large number of computers, peripherals and communications devices that host web sites, process transactions, manage financial and personal information, and other data processing and communications tasks. These installations are often constructed in a modular fashion, e.g., an installation may include a battery of standardized equipment racks (e.g., 19-inch racks) in which multiple computers and data communications devices, e.g., routers, hubs and the like, may be housed. Similar modular architectures may be used in telecommunications systems.

Typically, it is desirable for such installations to have high availability and reliability, such that, for example, data integrity and/or access is preserved even during disruptive events, such as power failures arising from storms, system overloads or other disturbances. Accordingly, such installations typically are powered by uninterruptible power supplies (UPSs), which can improve power quality and/or provide back up power to computing and communications equipment from an alternative source, such as a battery, generator or fuel cell, when utility power fails or is degraded.

Modular UPS systems have been proposed for such installations. For example, some manufacturers offer rackmount UPSs that are configured to be mounted in a standard (e.g., 19-inch) equipment rack, and that are hardwired (e.g., using lugs or screw terminals) to provide power interconnections. Some modular designs may include a chassis having a subrack or similar structure configured with a backplane or connector field that mates with power modules that slide into the subrack.

U.S. Pat. No. 6,967,283 to Rasmussen et al. describes systems and methods for installing computer equipment and power distribution equipment in facilities. Each of a plurality of equipment racks has a power input to receive power for equipment contained therein. A power distribution rack provides power to the equipment racks and includes a power distribution panel and a plurality of output power cables. A first end of an output cable is coupled to the power distribution panel and a second end of the output cable has a mating connector that pluggably mates with the power input of an equipment rack. The power cables are run from the power distribution rack to the equipment racks using power cable tracks that are located on roofs of the equipment racks.

While such an arrangement may have benefits, there is an ongoing need for improved power distribution techniques for such applications.

SUMMARY OF THE INVENTION

Embodiments of the present invention provide power interconnect assemblies. In the power interconnect assemblies, a longitudinally extending base member includes a plurality of longitudinally extending bus bar receiving channels. A plurality of longitudinally extending bus bars are positioned in respective ones of the bus bar receiving channels. An interconnect module is coupled to the base member. The interconnect module includes a connector member that is configured to receive a pluggable connectorized cable from a power component. A plurality of linking electrical connection members couple ones of a plurality of electrical connectors of the connector member to corresponding ones of the plurality of bus bars.

In other embodiments, the linking electrical connection members are configured to selectably couple the electrical connectors of the connector member to designated ones of the plurality of bus bars to define a connection arrangement between the connector member and the bus bars. A second interconnect module may be coupled to the base member at a position longitudinally displaced from the first interconnect module and a connection arrangement between a connector member of the second interconnect module and the bus bars may differ from the connection arrangement of the connector member of the first interconnect member. The connector member of the second interconnect member may have a same form factor as the connector member of the first interconnect member. The form factor may be a finger proof connector.

In further embodiments, the first and the second interconnect modules are coupled to the base member at selectable longitudinal locations on the base member and the linking electrical connection members couple the connector members to the bus bars at locations proximate the respective longitudinal locations. The channels may each include openings exposing bus bars positioned therein to allow coupling of the bus bars to the interconnect members proximate the interconnect members at a plurality of longitudinal locations. The base member may include a longitudinally extending interconnect module receiving portion configured to receive a plurality of longitudinally spaced interconnect modules and the openings in the channels may be longitudinally extending openings in the channels extending throughout the interconnect module receiving portion. The longitudinally extending openings may allow connection of the electrical connection members to the bus bars at any location in the interconnect module receiving portion.

In other embodiments, spacer member(s) are coupled to the base member and extends longitudinally between and abutting the first and second interconnect modules. The interconnect modules and spacer member(s) may extend from a first end of the base member to a second end of the base member around the bus bars to define a cavity enclosing the bus bars. The base member may further include a termination section at an end thereof including input connectors coupled to respective ones of the bus bars.

In yet further embodiments, the base member includes a longitudinally extending interconnect module receiving member including a longitudinally extending mounting channel on a face thereof. The interconnect modules are mounted to the base member by screw members received in and engaging the mounting channel. The base member may include a longitudinally extending interconnect module receiving portion configured to receive a plurality of longitudinally spaced interconnect modules and the mounting channel may extend through the interconnect module receiving portion to allow the interconnect modules to be mounted at the selectable longitudinal locations.

In other embodiments, the base member includes a rack mounting wall portion and a bus bar receiving portion. The rack mounting wall portion has interconnect module receiving channels on first and second ends thereof configured to receive ends of interconnect modules coupled to the base member. The bus bar receiving portion includes the bus bar receiving channels and extends from the rack mounting wall portion and has an end portion displaced from the rack mounting wall portion including the mounting channel therein to define the interconnect module receiving member. The base member may be an extruded polymeric member, such as polystyrene and/or polyphenylene ether.

In further embodiments, the interconnect modules each include a first and second L-shaped member. The first L-shaped member extends from a first end positioned in a first of the receiving channels of the rack mounting wall portion to a second end adjacent the interconnect module receiving member and extending over the mounting channel. The second L-shaped member extends from a first end positioned in the other of the receiving channels of the rack mounting wall portion to a second end adjacent the interconnect module receiving member and extending over the mounting channel with the first L-shaped member therebetween. A connector receiving opening is provided over the mounting channel defined by the overlapping first and second L-shaped members that is configured to receive the connector member. The first and second L-shaped members may be, for example, polystyrene and/or polyphenylene ether. A self-tapping screw may extend through the first and second L-shaped members and into the mounting channel to couple the first and second L-shaped members to the base member.

In other embodiments, the first connector member has a first keying arrangement and the second connector member has a second keying arrangement, different from the first keying arrangement, so that the first connector member will block insertion of a pluggable connectorized cable keyed to the second connector member and the second connector member will block insertion of a pluggable connectorized cable keyed to the first connector member. The interconnect module may include a plurality of connector members therein and a connection arrangement between ones of the connector members and the bus bars may differ for respective ones of the connector members.

Power assemblies are provided including a power interconnect assembly as described above mounted in a rack and further including a plurality of power components therein coupled to respective interconnect modules of the power interconnect assembly. The power interconnect assembly may include an interconnect module associated with each of the plurality of power components and may have an associated longitudinal location on the base member and an associated connection arrangement selected for the respective power component.

In some embodiments, power interconnect assemblies include a longitudinally extending base member including a plurality of longitudinally extending bus bar receiving channels configured to receive longitudinally extending bus bars. An interconnect module is configured to be coupled to the base member. The interconnect module is configured to receive a connector member that is configured to receive a pluggable connectorized cable from a power component. The base member is configured so that ones of a plurality of electrical connectors of the connector member may be coupled to corresponding ones of the bus bars with the bus bars inserted in the channels.

In yet other embodiments, the channels each include openings for exposing bus bars positioned therein to allow coupling of the bus bars to the connector member at a plurality of longitudinal locations. The base member may include a longitudinally extending interconnect module receiving portion configured to receive a plurality of longitudinally spaced interconnect modules having connector members and the openings in the channels may be longitudinally extending openings in the channels extending throughout the interconnect module receiving portion and the longitudinally extending openings may allow connection of the connector members to the bus bars at any location in the interconnect module receiving portion. The interconnect modules may extend from a first end of the base member to a second end of the base member around the bus bar receiving channels to define a cavity enclosing the bus bars. The base member may include a longitudinally extending interconnect module receiving member including a longitudinally extending mounting channel on a face thereof and the mounting channel may be configured to allow the interconnect modules to be mounted to the base member by screw members received in and engaging the mounting channel. The mounting channel may extend through the interconnect module receiving portion to allow the interconnect modules to be mounted at selectable longitudinal locations.

In further embodiments, methods of configuring a power interconnect assembly for use in a power supply having associated electrical bus connections include identifying a plurality of power components of the power supply and determining a connection arrangement for each of the plurality of power components to the electrical bus connections. A longitudinally extending base member is provided including a plurality of bus bars therein corresponding to respective ones of the electrical bus connections. A plurality of connector members are provided, each of the connector members being configured to receive a pluggable connectorized cable from a power component and having a plurality of electrical connectors at defined positions therein. Ones of the plurality of electrical connectors of ones of the plurality of connectors are electrically connected to corresponding ones of the bus bars based on the determined connection arrangement of respective ones of the power components to be associated with the connector members. An interconnect module is coupled to the base member, covering the bus bars, for each of the plurality of power components, with its associated connector member positioned therein to provide a configured power interconnect assembly.

In other embodiments, the methods further include determining a longitudinal location associated with each of the plurality of power components and coupling the interconnect module includes coupling the interconnect module having the connector associated with a respective power component to the base member at the determined longitudinal location for the associated power component for each of the power components. The methods may further include mounting the configured power interconnect assembly to a rack of the power supply, positioning the plurality of power components in the rack and coupling respective ones of the power components to their associated connector members in the power interconnect assembly using pluggable connectorized cables extending from the respective ones of the power components.

DETAILED DESCRIPTION

Figure 1A:
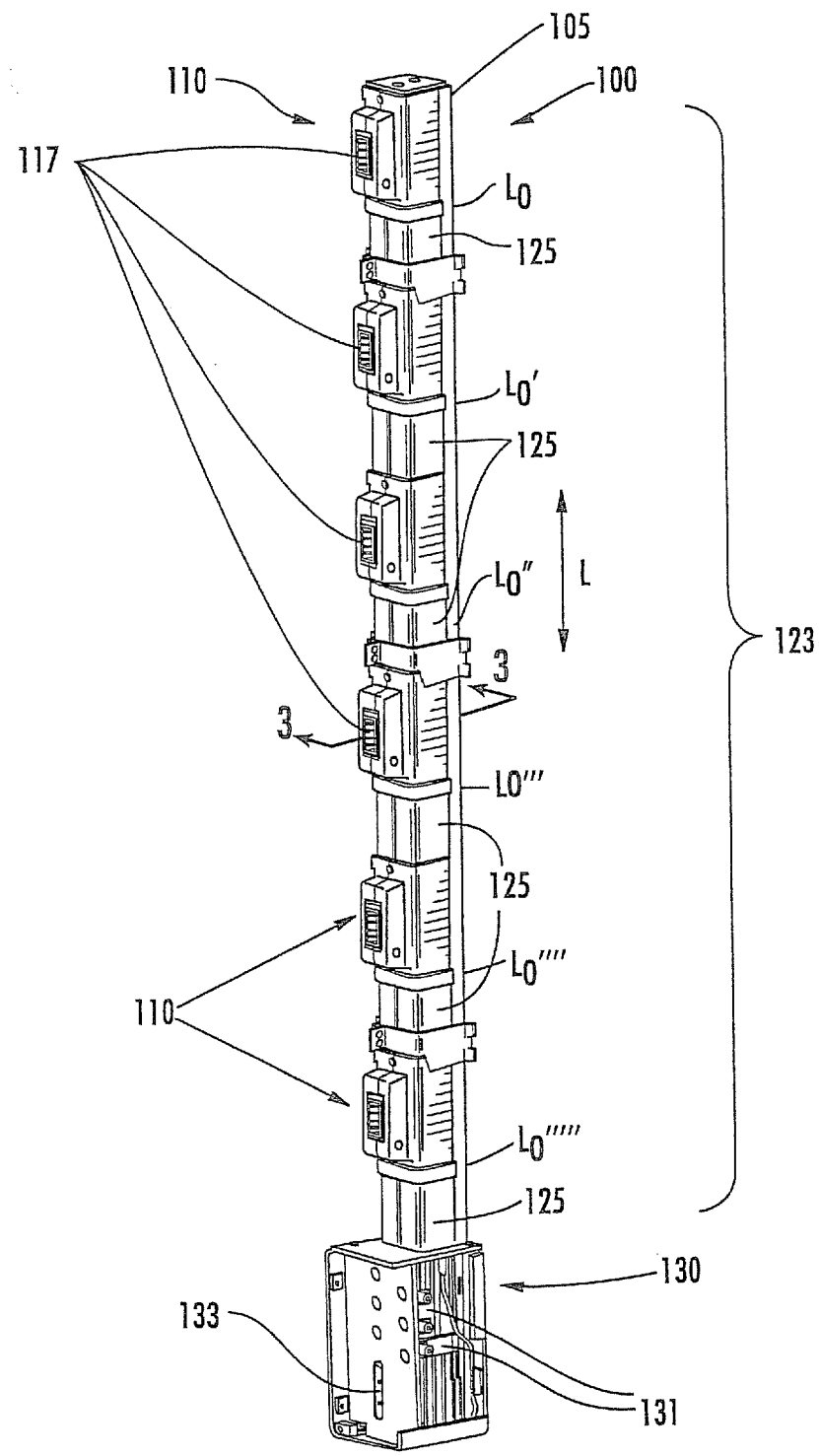
FIG. 1A is a perspective view of a power interconnect assembly according to some embodiments of the present invention.

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular exemplary embodiments illustrated in the accompanying drawings is not intended to be limiting of the invention. In the drawings, like numbers refer to like elements.

As used herein, the singular forms "a", "an" and "the" are intended to include the plural forms as well, unless expressly stated otherwise. It will be further understood that the terms "comprises," "includes," "comprising" and/or "including," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
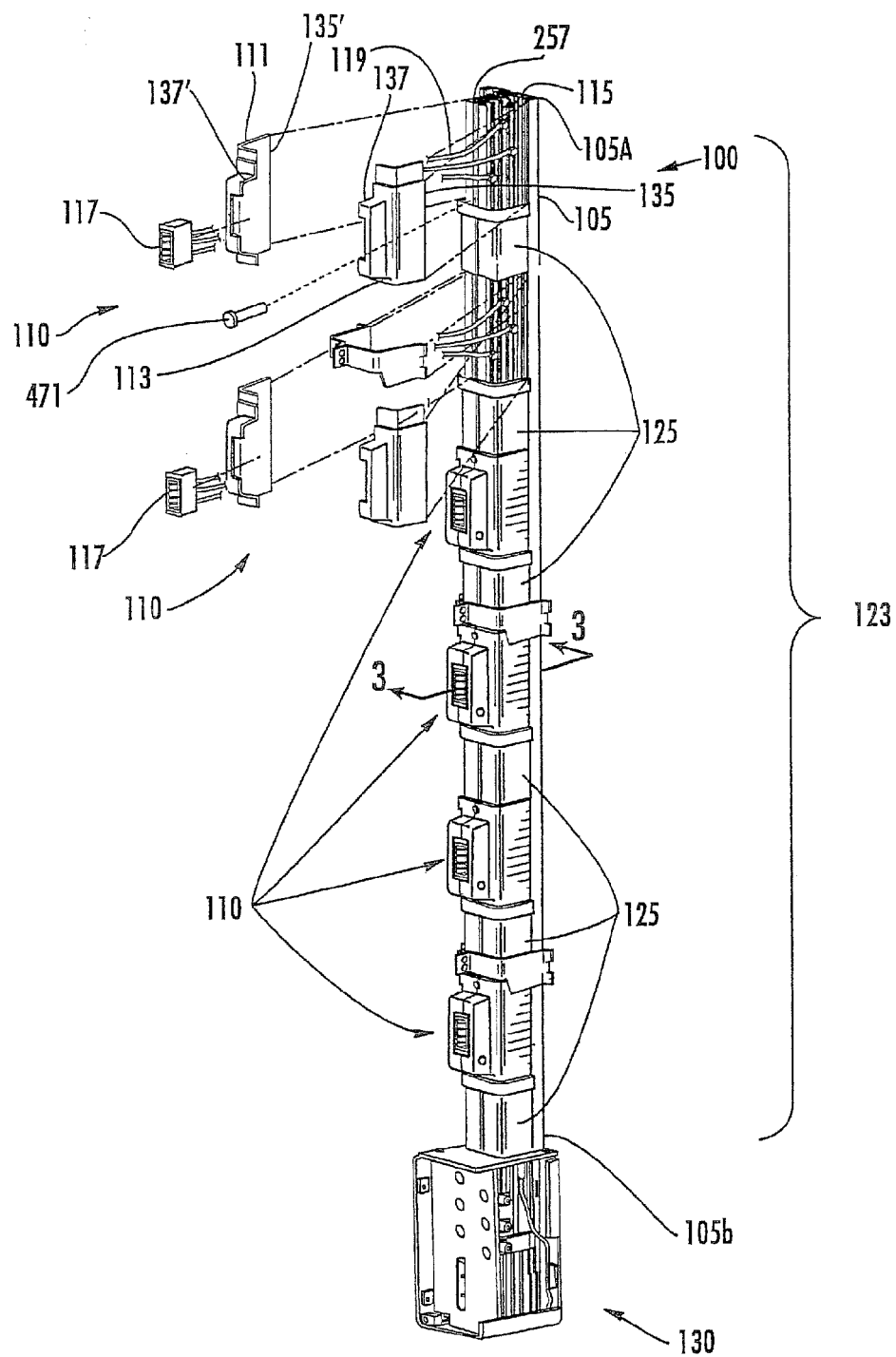
FIG. 1B is an exploded perspective view of the power interconnect assembly of FIG. 1A.
Figure 2:
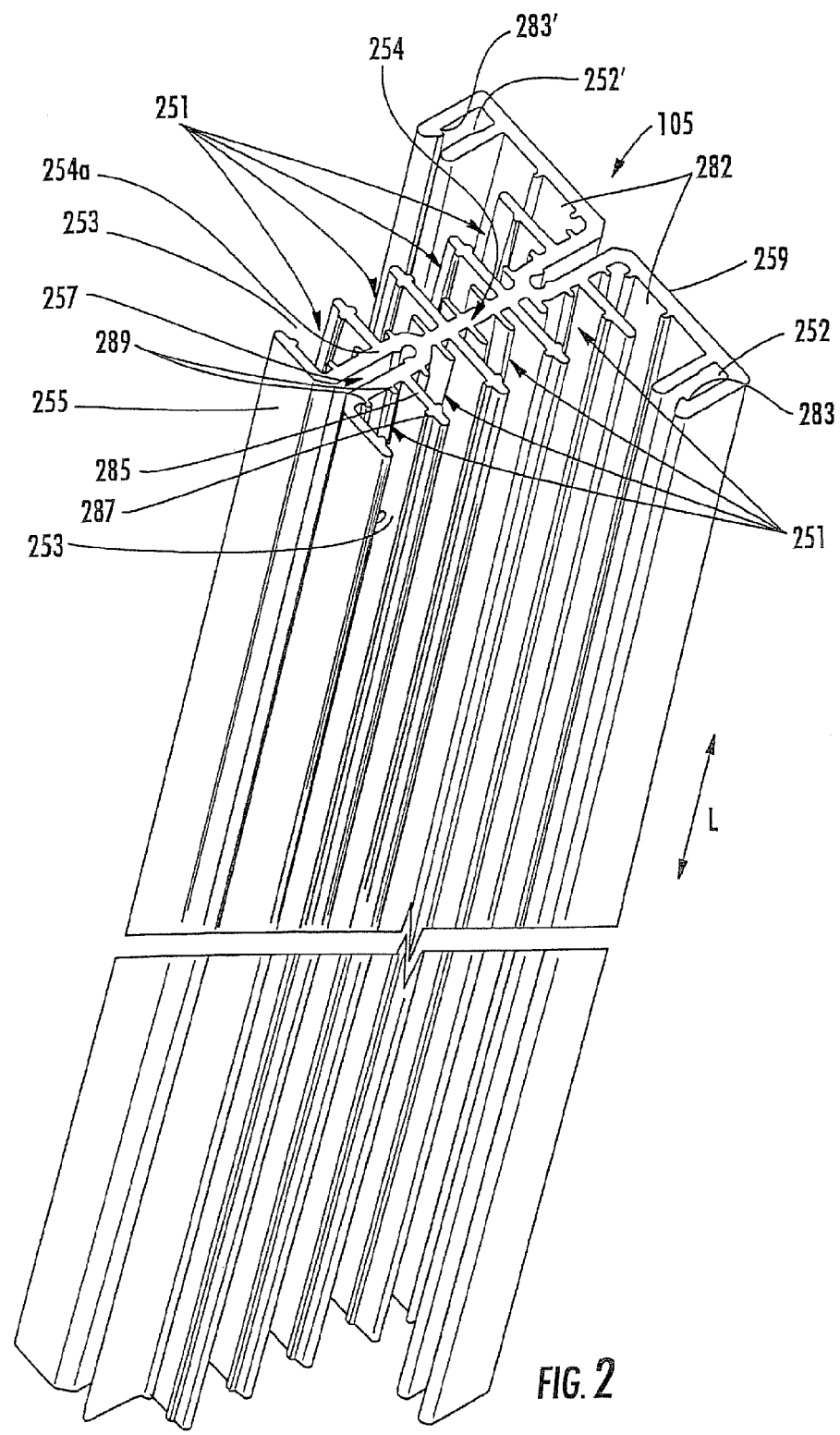
FIG. 2 is a perspective view of a based member for a power interconnect assembly according to some embodiments of the present invention.
Figure 3:
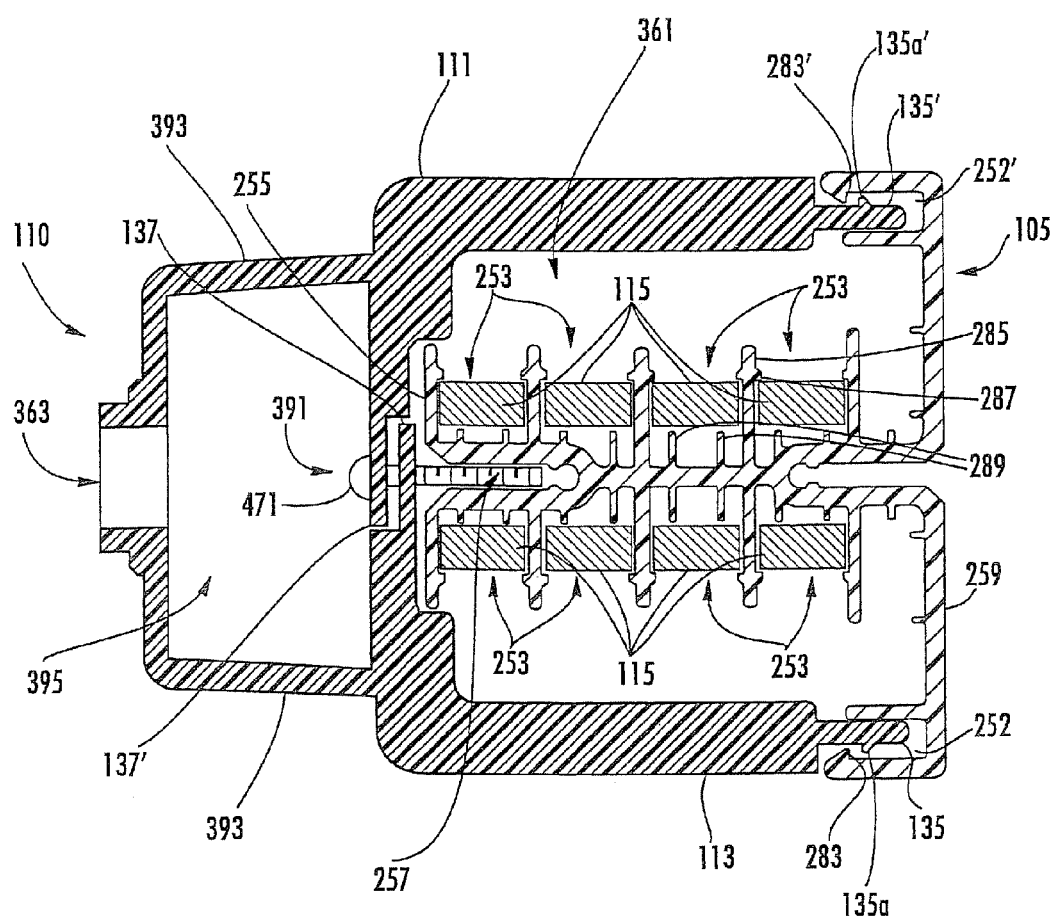
FIG. 3 is a cross-sectional view taken along line 3-3 of FIG. 1.

Power interconnect assemblies 100 according to some embodiments of the present invention will now be described with reference to FIGS. 1A through 7B. FIG. 1A is a perspective view of a power interconnect assembly 100 and FIG. 1B is a partially exploded perspective view of the power interconnect assembly 100 of FIG. 1A. FIG. 3 is a cross-sectional view of the power interconnect assembly 100 of FIG. 1A, taken generally along a line 3-3 as shown in FIG. 1A.

As shown in FIGS. 1A, 1B and 3, a power interconnect assembly 100, according to some embodiments of the present invention, includes a longitudinally extending base member 105 with one or more interconnect modules 110 coupled to the base member 105. The power interconnect assembly 100 includes a longitudinally extending interconnect module receiving portion 123 and a termination section 130 on an end thereof.

The interconnect module receiving portion 123 is configured to receive a plurality of longitudinally spaced interconnect modules 110. Note that, as used herein, the longitudinal direction refers to the direction indicated by the arrow L of FIG. 1A. As further seen in the embodiments of FIGS. 1A and 1B, spacer members 125 coupled to the base member 105 extend longitudinally between and abut ones of the interconnect modules 110. The interconnect modules 110 and spacer members 125 extend from a first end 105a of the base member 105 to a second end 105b of the base member 105 to define a cavity 361 (FIG. 3). As best seen in FIGS. 1B and 3, a plurality of longitudinally extending bus bars 115 of the power interconnect assembly 100 are enclosed by the cavity 361. As the bus bars 115 may be coupled to high voltage and/or current sources, the enclosing cavity 361 may provide for protection from unintended incidental contact with such high voltage and/or current sources.

Embodiments of the base member 105 will now be further described with reference to the perspective view illustration of FIG. 2. As seen in FIG. 2, the longitudinally extending base member 105 extends along the longitudinal axis L. The base member 105 includes a plurality of longitudinally extending bus bar receiving channels 251, in which a plurality of longitudinally extending bus bars 115 may be positioned, as seen in FIG. 3. The channels 251 each include openings 253 exposing bus bars 115 positioned therein to allow coupling of the bus bars 115 to the interconnect members 110 proximate the interconnect members 110 at a plurality of longitudinal locations $L_0$, $L_0'$, $L_0''$, $L_0'''$, $L_0''''$, $L_0'''''$ along the base member 105. In the particular embodiments shown in FIG. 2, the openings 253 are longitudinally extending openings extending throughout the interconnect module receiving portion 123 (see FIG. 1B) that allow connection of electrical connection members of the interconnect modules 110 to the bus bars 115 at any location in the interconnect module receiving portion 123.

Figure 4:
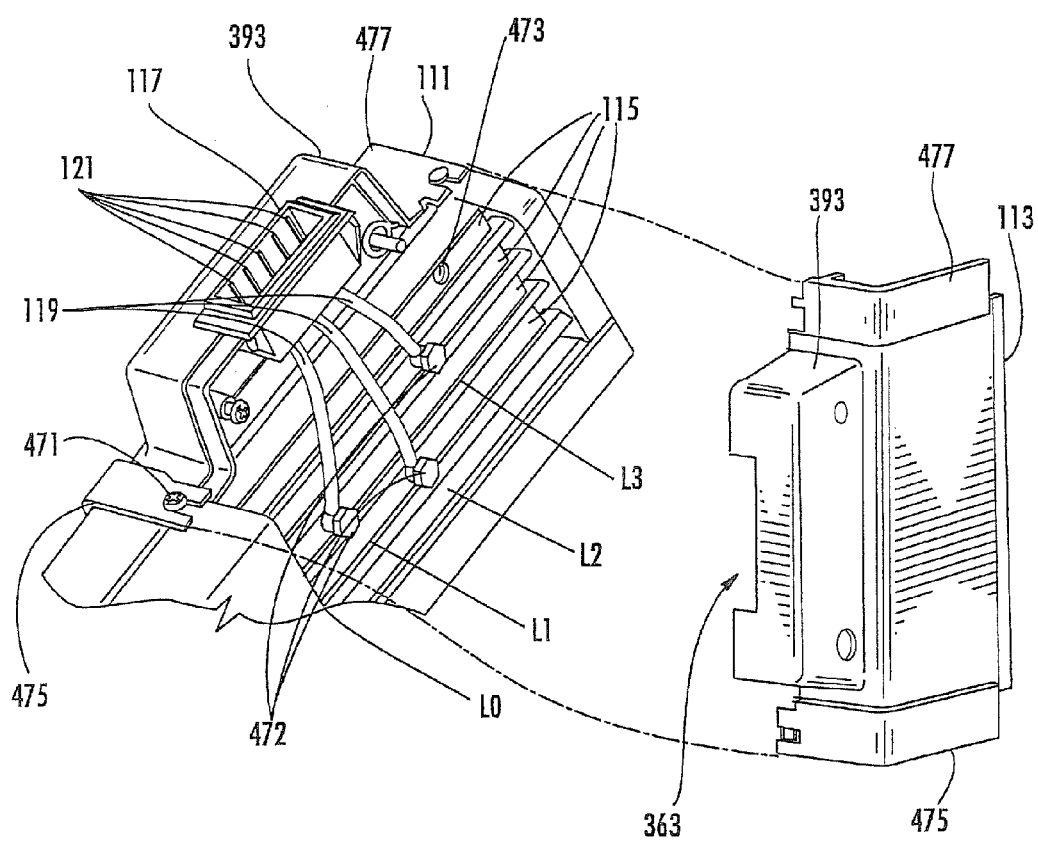
FIG. 4 is a partially exploded view of an interconnect module coupled to a plurality of bus bars according to some embodiments of the present invention.

For the embodiments of the base member 105 illustrated in FIG. 2, the base member 105 further includes a longitudinally extending interconnect module receiving member 255. The interconnect module receiving member 255 includes a longitudinally extending mounting channel 257 on a face thereof. As seen in FIG. 1B and FIG. 4, the interconnect modules 110 may be mounted to the base member 105 by screw members 471 received in and engaging the mounting channel 257. The mounting channel 257 in some embodiments extends through the interconnect module receiving portion 123 to allow the interconnect modules to be mounted at selectable longitudinal locations $L_0$, $L_0'$, $L_0''$, $L_0'''$, $L_0''''$, $L_0'''''$ (see FIG. 1A).

As further seen in the embodiments of the base member 105 illustrated in FIG. 2, the base member 105 includes a rack mounting wall portion 259 and a bus bar receiving portion 254, including the bus bar receiving channels 251, extending from the rack mounting wall portion 259. The rack mounting wall portion 259 includes interconnect module receiving channels 252, 252' on respective first and second ends thereof. The receiving channels 252, 252' are configured to receive ends 135, 135' of the interconnect modules 110 coupled to the base member 105 as seen in FIG. 3. The bus bar receiving portion 254 has an end portion 254a, displaced from the rack mounting wall portion 259, that includes the mounting channels 257 therein and defines the interconnect module receiving member 255.

In some embodiments of the present invention, the base member 105 is an extruded polymeric member. For example, the base member 105 may be polystyrene and/or polyphenylene ether. In the particular embodiments shown in FIG. 2, the base member 105 is a longitudinally extending extruded member having uniform cross-sectional shape throughout both the interconnect module receiving portion 123 and through the termination section 130. The length of the base member 105 may be varied and selected to conform with the requirements and dimensions of a power assembly rack in which it will be utilized or the like. Thus, flexibility may be provided, in some embodiments of the present invention, as to both the longitudinal position of the interconnect modules 110 and the number of interconnect modules 110 that may be accommodated, as well as the range of locations over which they may be positioned. Thus, for example, a power interconnect assembly 100 may be sized to extend across a rack, a plurality of racks, or the like, by variations in the length of the base member 105 utilized and a single termination section 130 or multiple termination sections 130 may be provided on a given base member 105. Similarly, a variation in the number of bus bars 115 accommodated in the power interconnect assembly 100 may be provided by variations in the number of channels 251 provided in the base member 105 and/or the number of channels into which a bus bar 115 is inserted.

In the particular embodiments illustrated in FIG. 2 and FIG. 3, eight channels 251 are shown, with four on each side of the receiving portion 254. In the particular embodiments illustrated in FIGS. 2 and 3, two additional bus bars 115 may be accommodated in the channels 282 on each side of the bus bar receiving portion 254. Each of the channels 251 in the embodiments of FIGS. 2 and 3 are defined by respective pairs of partition walls 285. In addition, a thickened retaining tab portion 287 is shown on each of the partition walls 285 that may be used to retain a bus bar 115 snapped into a respective channel 251 through a corresponding opening 253 in the channel 251 or slid through an end of the channel 251.

Also shown in the embodiments of FIGS. 2 and 3 are spacers 289 positioned on a bottom wall of the respective channels 251 extending between the partition walls 285 thereof. The spacers 289 may serve to position the bus bars 115 displaced from the back wall. Such an arrangement may facilitate cooling of the bus bars 115 by allowing increased airflow to pass along a back face of the respective bus bars 115 in the channels 251.

As best seen in FIG. 3, the first L-shaped member 113 extends from a first end 135 positioned in a first 252 of the receiving channels of the rack mounting wall portion 259 to a second end 137 adjacent the interconnect module receiving member 255 and extending over the mounting channel 257. The second L-shaped member 111 extends from a first end 135' positioned in the other 252' of the receiving channels of the rack mounting wall portion 259 to a second end 137' adjacent the interconnect module receiving member 255 and extending over the mounting channel 257 with the first L-shaped member 113 therebetween. The connector receiving opening 363 is positioned over the mounting channel 257 and is defined by the overlapping first 113 and second 111 L-shaped members and is configured to receive the connecting member 117. The first 113 and second 111 L-shaped members may be, for example, a polymer such as polystyrene and/or polyphenylene ether (e.g., Noryl®).

An additional feature shown in the embodiments illustrated in FIGS. 2 and 3 is a snap lock arrangement for coupling the respective L-shaped members 111, 113 to the base member 105 so as to provide the enclosed cavity 361 surrounding the bus bars 115. In particular, each of the interconnect module receiving channels 252, 252' includes a corresponding lock tab 283, 283' configured and positioned to cooperate with respective lock tabs 135a, 135a' located on the ends 135, 135' of the L-shaped members 111, 113.

For some embodiments of the present invention, as best seen in FIG. 3, each of the L-shaped members 111, 113 includes an extension portion 393 thereon which, once positioned as shown in FIG. 3, define an opening 363 configured to receive the connector member 117. The extension portions 393 further define an enclosed volume 395 in which electrical connections, such as wiring and the like, may be arranged. FIG. 3 also illustrates an overlap portion 391 formed by the overlapping ends portions 137, 137' of the respective L-shape members 111, 113. Note that the cross-sectional illustration of FIG. 3 includes this overlap portion 391 and the opening 363. However, it will be understood that the cross-sectional view of FIG. 3 is not on a straight line in this region with respect to the line 3-3 of FIG. 1A as an opening, rather than an overlap, would extend from the volume 395 into the cavity 361 to allow passage of linking electrical connector members 119 (FIG. 4) between a connector member 117 in the opening 363 and respective ones of the bus bars 115 to provide a desired connection arrangement for the connector member 117. However, the overlapping portions of the ends 137, 137' are shown, nonetheless, in the cross-sectional view of FIG. 3 for illustrative purposes.

Referring now to FIGS. 1B and 4, the power interconnect assembly 100 in the illustrated embodiments includes a plurality of linking electrical connection members 119 coupling ones of a plurality of electrical connectors 121 of the connector member 117 to corresponding ones of the plurality of bus bars 115. The connection members 119 are shown as coupled to respective bus bars 115 by a connector member, such as a bolt 472 engaged in a threaded opening 473 formed in the bus bar at a location proximate the connector member 117. The linking electrical connection members 119 allow the electrical connectors 121 of the connector member 117 to be selectively coupled to designated ones of the plurality of bus bars 115 to define a connection arrangement between the connector member 117 and the bus bars 115. Different ones of the interconnect modules 110 and the respective connector members 117, in some embodiments, may include a connection arrangement between the connector members 117 and the bus bars 115 that differs between the respective connector members 117. Nonetheless, the connector members 117 themselves may have a same form factor across different interconnect modules 110. In some embodiments, the form factor is a fingerproof connector, such as fingerproof power pole pack connectors available from Anderson Power Products.

As seen in the embodiments of FIG. 1A and FIG. 4, respective ones of the interconnect modules 110 are coupled to the base member 105 at selectable longitudinal locations $L_0$, $L_0'$, $L_0''$, $L_0'''$, $L_0''''$, $L_0'''''$. In each of the respective locations, such as illustrated for the location $L_0$ in FIG. 4, the linking electrical connection members 119 couple the connector members 117 to the bus bars 115 at locations $L_1$, $L_2$, $L_3$ proximate the respective longitudinal locations $L_0$, $L_0'$, $L_0''$, $L_0'''$, $L_0''''$, $L_0'''''$.

The connector 117 may have a keying arrangement in some embodiments of the present invention restricting what profile corresponding pluggable connectorized cable from a power component may be received in the keyed connector member 117. Different ones of the connector members 117 may have different keying arrangements so that a first of the connector members 117 may block insertion of a pluggable connectorized cable keyed to a second of the connector members 117 and the second connector member 117 may block insertion of a pluggable connectorized cable keyed to the first connector member 117.

As also seen in FIG. 1B and FIG. 4, a self tapping screw member 471 may be used extending through the first 113 and second 111 L-shaped members and into the mounting channel 257 to couple the first 113 and second 111 L-shaped members to the base member 105. Such an arrangement may be utilized to allow flexible positioning of the connector member 117 and interconnect module 110 at any desired selectable longitudinal location along the interconnect module receiving portion 123 of the interconnect assembly 100.

As seen in FIG. 1A, the interconnect modules 110, alone or in combination with the spacer members 125, may be arranged in an abutting relationship at respective longitudinal locations along the base member 105. The interconnect modules 110 may abut each other or may abut a spacer member 125 positioned therebetween. As seen in FIG. 4, respective mating portions 475, 477 may be provided on the interconnect modules 110 to allow for an interleaved an overlapping relation between adjacent interconnect modules 110 and/or spacer members 125 so as to define the cavity 361 enclosing the bus bars 115.

Figure 5:
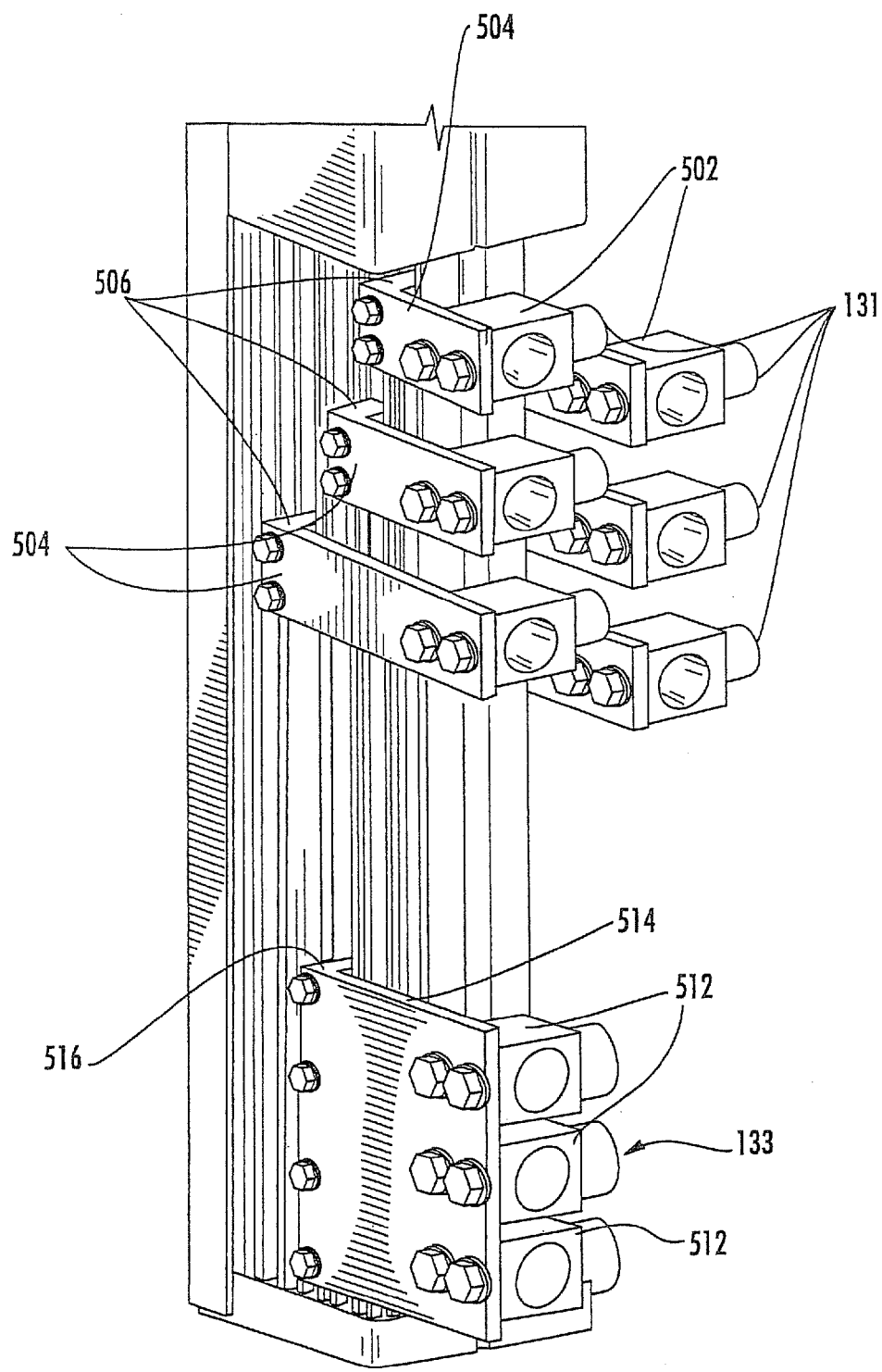
FIG. 5 is a perspective view of a power interconnect assembly termination section according to some embodiments of the present invention.
Figure 6A:
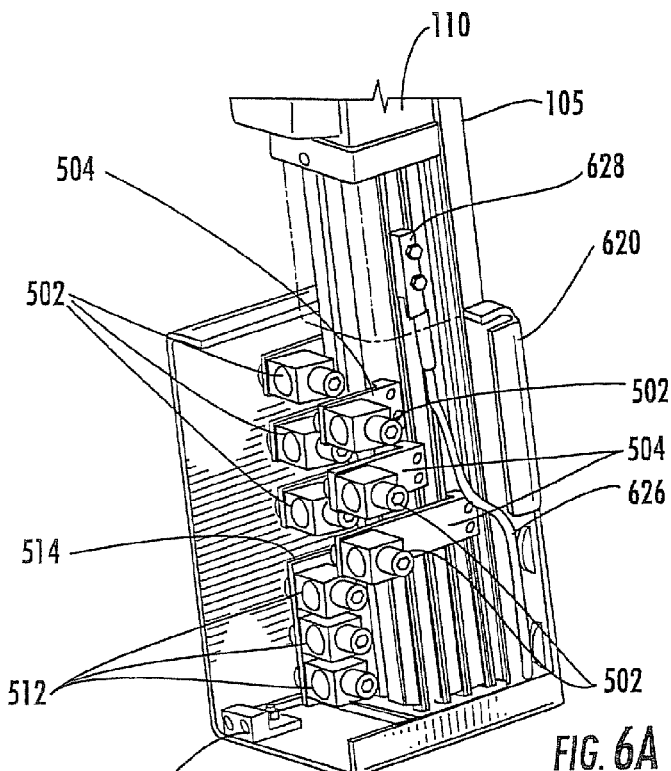
FIGS. 6A and 6B are perspective views of a power interconnect assembly termination section according to some embodiments of the present invention.
Figure 6B:
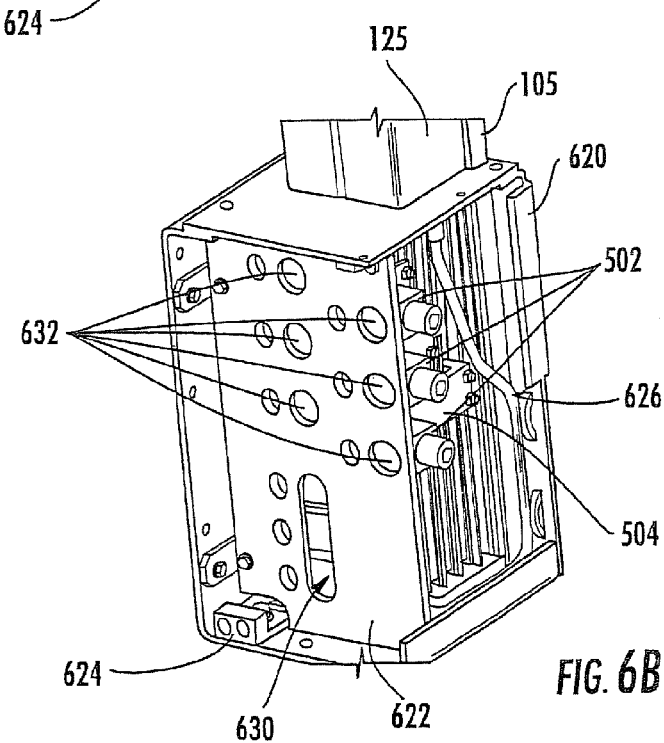

Arrangements according to some embodiments of the present invention suitable for use in the termination section 130 will now be further described with reference to the illustrations of FIG. 5, 6A and 6B. As shown in FIGS. 5, 6A and 6B, a plurality of input connectors 131, 133 are included in the terminated section 130 that are coupled to respective ones of the bus bars 115. The input connectors 131 are shown arranged to provide connection of an input cable or the like to a respective associated single one of the bus bars 115, including providing a cable connection portion 502 coupled by respective different length bridging members 504 to the bus bar connector portion 506.

As shown in the arrangement of FIGS. 5, 6A and 6B, the variable length of the bridging members 504 may allow for positioning of each of the cable connection portions 502 along a common plane, while connecting the respective connectors 131 to different ones of the bus bars 115 in a one-to-one relationship. A bridging member 514 allows connection of multiple layer cable connection portions 512 to a same one of the bus bars 115 through a bus bar connecting portion 516 extending from the common bridging member 514. Thus, with the arrangement of FIG. 5, multiple input/output lines may be coupled to a single bus bar 115 using the connectors 133, while other ones of the bus bars 115, six of them as shown in FIG. 5, may be connected to separate single input lines.

As seen in FIGS. 6A and 6B an eighth of the bus bars 115 may be separately connected to using a wire bus bar connection member 628 having a cable 626 extending therefrom to an input connector 624. For example, the bus bar 115 coupled to by the connector 628 may provide a neutral reference coupled through the input connector 624 in some arrangements.

As also seen in FIGS. 6A and 6B, the termination section 130 may include a protected housing member 620 around the input connectors 131, 133, 624. A protective plate 622 may be coupled to the housing 620. The plate 622 may include openings 632 for receiving input wires coupled through the connectors 131 and an opening 630 receiving wires coupled through the input connectors 133. The plate 622 further is shown as including a cut-out for the input connector 624.

Figure 7A:
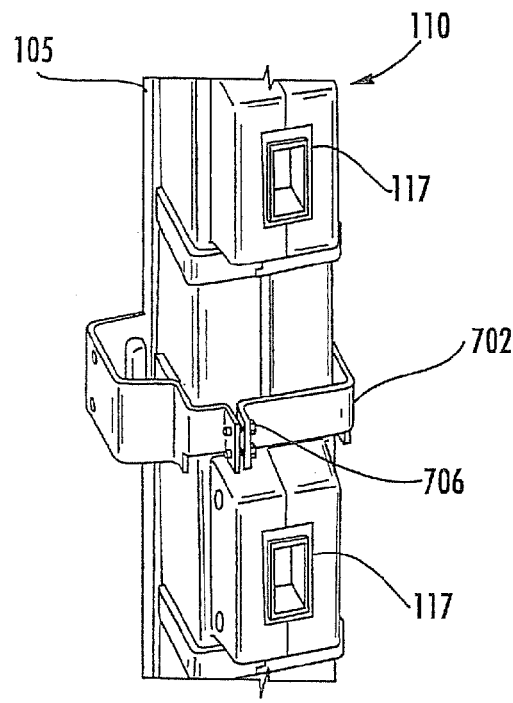
FIGS. 7A and 7B are perspective views of a bracket for a power interconnect assembly according to some embodiments of the present invention.
Figure 7B:
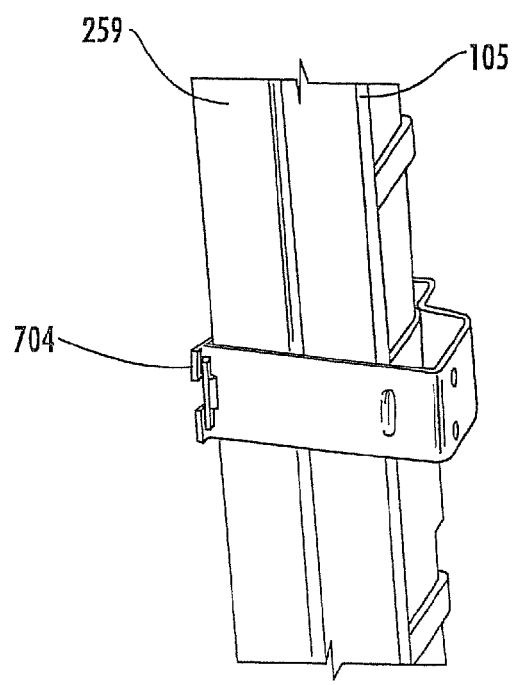

Referring now to FIGS. 7A and 7B, an interconnect module 110 may include a plurality of connector members 117 therein. The connection arrangement between ones of the connector members 117 and the bus bars 115 may differ for respective ones of connector members 117 of an interconnect module 110 and the respective connector members 117 may have the same form factor as seen in FIG. 7A.

Also illustrated in the embodiments of FIGS. 7A and 7B is a bracketing arrangement that may be used to couple a power interconnect assembly 100 to a rack of a power assembly or the like. A two part bracket 702 is shown in FIGS. 7A and 7B extending around the power interconnect assembly 100. The respective halves of the bracket 702 are coupled at one end through interlocking portions 704 and another end by connector members 706 so as to be wrapped around a power interconnect assembly 100 and coupled thereto. The bracket 702 may be arranged to have a face thereof configured to mate with a corresponding receiving channel, bracket or the like positioned in a power supply rack. A plurality of brackets 702 may be used for coupling a power interconnect assembly 100 to a rack of a power assembly or the like. Once in the rack, respective ones of the power components may be coupled to the corresponding interconnect module 110 and connector members 117 having the desired connection arrangement to the bus bars 115 for the respective power components.

Figure 8:
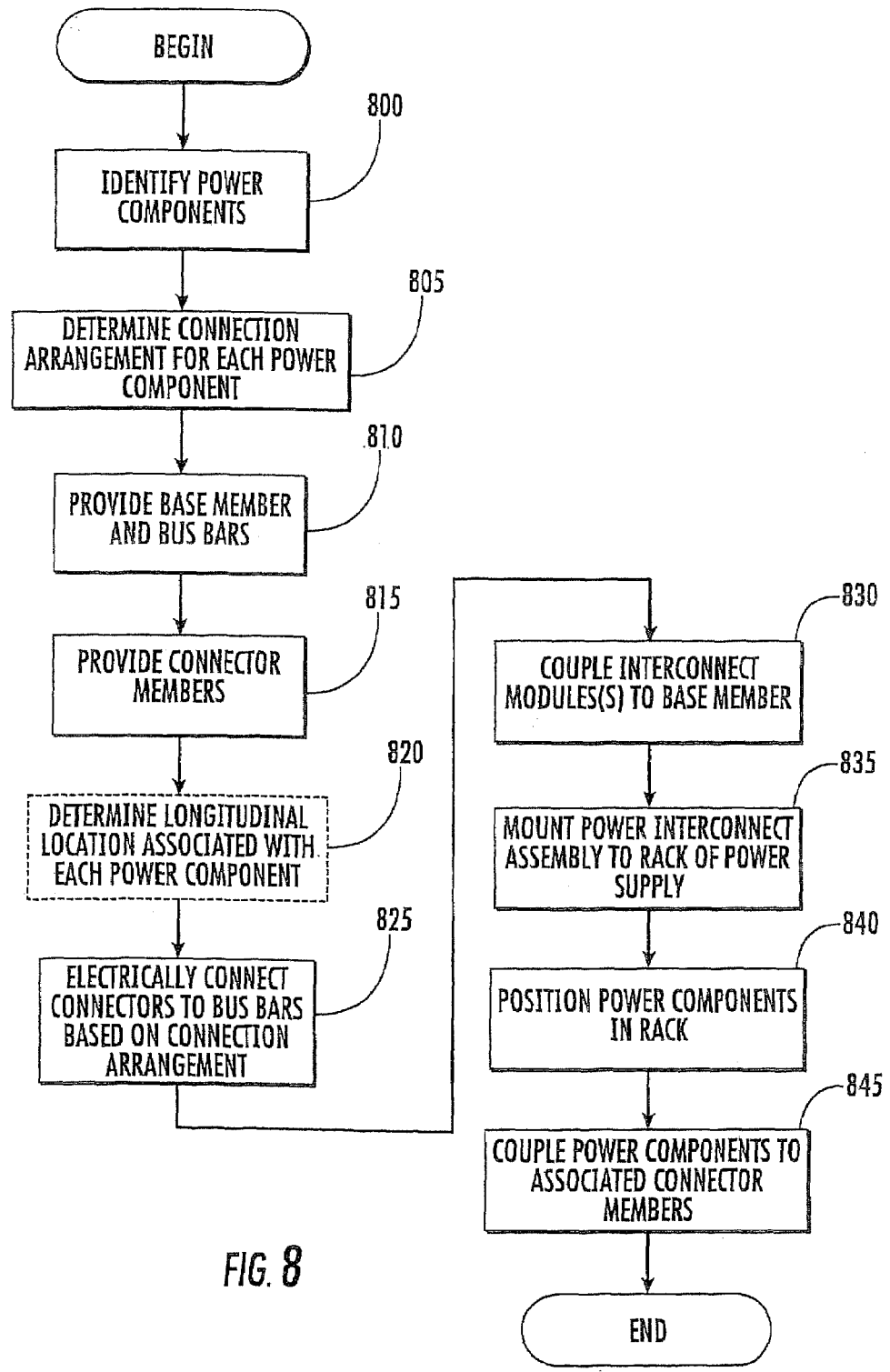
FIG. 8 is a flow chart illustrating operations for configuring a power interconnect assembly for use in a power supply according to some embodiments of the present invention.

Referring now to FIG. 8, methods of configuring a power interconnect assembly 100 for use in a power supply having associated electrical bus connections, according to some embodiments of the present invention, will now be further described. As illustrated in the embodiments of FIG. 8, a plurality of power components of the power supply are identified (block 800). A connection arrangement for each of the plurality of power components to the electrical bus connections are determined (block 805).

A longitudinally extending base member, including a plurality of bus bars therein corresponding to respective ones of the electrical bus connections, is provided (block 810). In addition, a plurality of connector members, each of the connector members being configured to receive a pluggable connectorized cable from a power component, are provided (block 815). Each of the connector members provided at block 815 has a plurality of electrical connectors at defined positions therein. In some embodiments of the present invention, as illustrated at block 820, a longitudinal location associated with each of the plurality of power components is also determined.

Ones of the electrical connectors are electrically connected to corresponding ones of the bus bars based on the determined connection arrangement of respective ones of the power components to be associated with the connector member (block 825). An interconnect module is coupled to the base member for each of the plurality of power components with the associated connector member positioned therein to provide a configured power interconnect assembly covering the bus bars (block 830). The respective interconnect modules and connector members may be positioned on the base member at determined longitudinal locations for the associated power component members in embodiments where the power components are determined to have associated longitudinal locations at block 820.

In some embodiments of the present invention, operations further include mounting the configured power interconnect assembly to a rack of the power supply (block 835). The plurality of power components are positioned in the rack (block 840). Respective ones of the power components are coupled to their associated connector members in the power interconnect assembly using pluggable connectorized cables extending from their respective ones of the power components (block 845).

According to various embodiments of the present invention, power interconnect assemblies along the lines described above with reference to FIGS. 1-8 may be used to support modular UPS systems and electronic systems including such UPS system that have a variety of flexible "plug and play" configurations. In particular a UPS system may include a plurality of UPS system component modules, such as UPS modules, battery modules, power distribution modules, and the like. Each may be configured to be arranged in one or more equipment racks and may include at least one flexible power cable extending therefrom and a pluggable connector at an end thereof. The UPS system may further include a modular power interconnect assembly, e.g., an assembly configured along the lines of the assemblies described above. The power interconnect assembly may be attached to the one or more equipment racks in a number of different ways, as described in further detail below. Respective ones of the connectors of the UPS system component modules are pluggably mated with respective ones of connectors of the power interconnect assembly such that the power interconnect assembly provides electrical interconnection among the plurality of UPS system component modules.

In further embodiments, such UPS system components may be integrated with load modules in equipment racks. For example, UPS modules and/or other UPS system component modules, such as battery modules, transformer modules, switch modules, and power distribution unit (PDU) modules, may be arranged in one or more equipment racks that also house loads, such as servers, routers, hubs and other data processing and/or data communications equipment. The UPS modules and/or other UPS system components may be configured to provide power to such loads. The UPS system component modules may be interconnected using one or more modular power interconnect assemblies along lines described herein to provide, among other things, input power paralleling, output power paralleling, battery power distribution and the like among the UPS system component modules.

Figure 9:
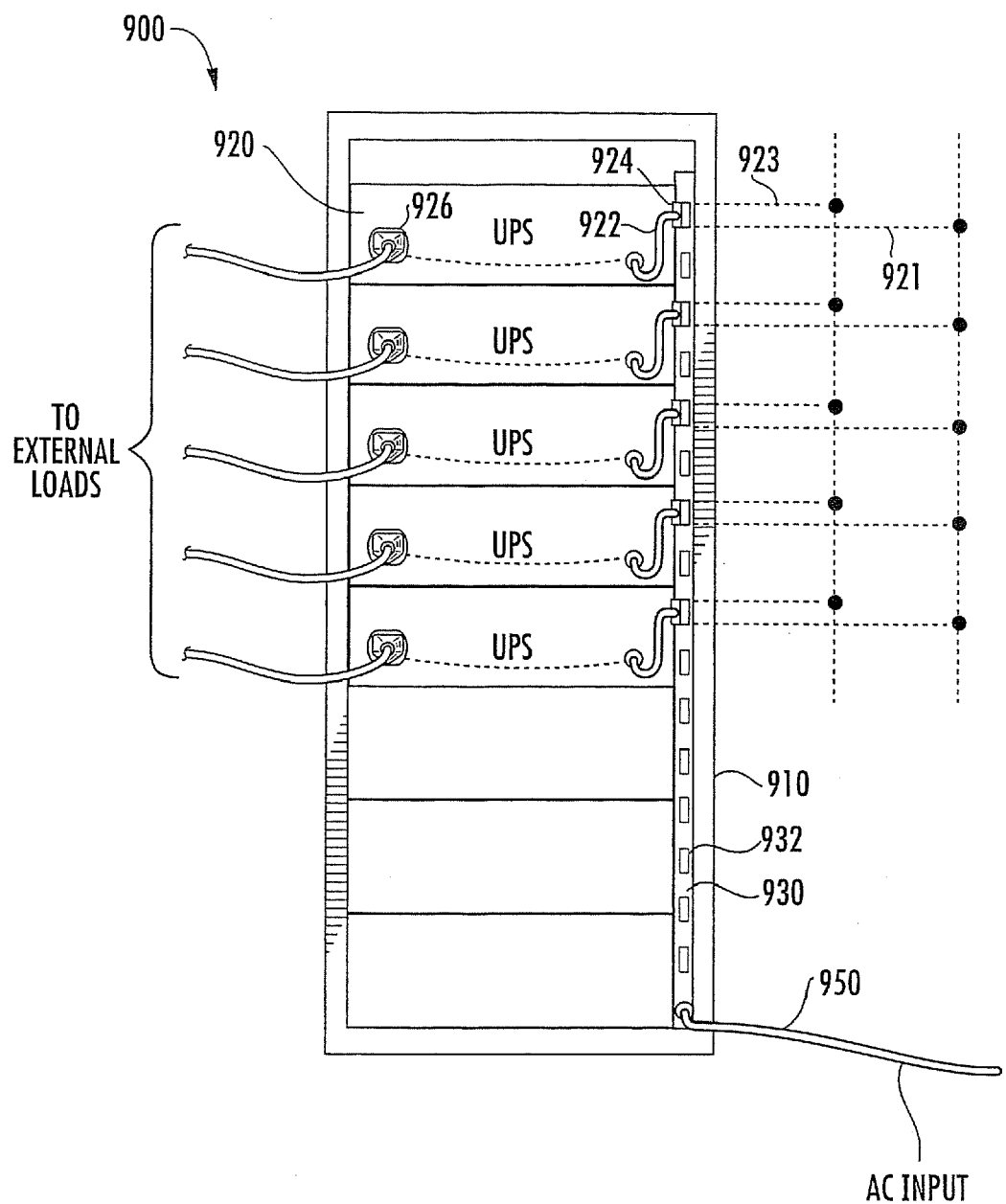
FIG. 9 illustrates a UPS system including a plurality of UPS modules according to some embodiments of the present invention.

FIG. 9 illustrates a modular UPS system 900 according to some embodiments of the present invention, more particularly, an example of how a modular power interconnect assembly may be used to support paralleling of UPS system components. The system 900 includes an equipment rack 910, e.g., a standard 19-inch or similar rack. A plurality of UPS system component modules, here shown as including a plurality of UPS modules 920, is arranged in a columnar fashion in the rack 910. The UPS modules 920 may include any of a number of different types of UPSs, for example, on-line, standby, line-interactive or other types of UPSs. Each UPS module 920 has a flexible power cable 922 extending therefrom and terminating with a connector 924. In the illustrated embodiments, each UPS module 920 further includes at least one power outlet 926 that is configured to be connected to external loads.

The system 900 further includes a modular power interconnect assembly 930 that is attached to the equipment rack 910. The power interconnect assembly 930 may have a configuration along the lines described above with reference to FIGS. 1-8, i.e., may include an elongate housing with a plurality of substantially parallel bus bars running along a length thereof, with connectors 932 positioned at a face of the housing and spaced along the length of the housing. The power interconnect assembly 930 may be attached or otherwise mounted in and/or on the equipment rack using, for example, the mounting configuration described above.

As further shown in FIG. 9, the power interconnect assembly 930 may be configured to support parallel interconnection of the UPS modules 920 when the connectors 924 of the power cables 922 of the UPS modules 920 are pluggably mated with the connectors 932 of the power interconnect assembly 930. In particular, as shown in dashed line, power inputs 921 of the UPS modules may be parallel connected by common connection to a bus bar(s) in the power interconnect assembly 930. The power inputs 921 may be fed, for example, from an AC input cable 950 attached at or near a bottom end of the power interconnect assembly 230.

Similarly, power outputs 923 of the UPS modules 920 may be parallel connected by, for example, common connection to another bus bar(s) of the power interconnect assembly 930. As shown, the parallel connected power outputs 923 may also be electrically coupled to the power outlets 926 of the UPS modules 920 that serve external loads. It will be appreciated that, in this manner, the UPS modules 920 may operated in a parallel redundant manner such that, for example, a load coupled to a given one of the UPS modules 920 may be served by one or more of the other UPS modules 920 in event of failure of the given UPS module 920. It will be appreciated that, although FIG. 9 illustrates provision of power to external loads via outlets 926, other embodiments of the present invention may connect to loads in other ways. For example, loads may be connected via the power interconnect assembly 930 (or another such assembly), e.g., a power cable may be connected to output power bus bars of the power interconnect assembly 930 and fed to a power distribution (PDU) module positioned in the same rack or in another rack that provides for connection of loads. For example, a modular power interconnect assembly, e.g., the assembly 930, may support connection between the UPS modules 920 and a power distribution rack that serves rackmounted loads as described in a copending U.S. patent application Ser. No. 11/378,054, entitled "Modular Electronic Systems and Methods using a Flexible Power Distribution Interface," filed concurrently herewith and incorporated herein by reference in its entirety.

The power interconnect assembly 930 may support additional connections. For example, in some embodiments of the present invention, the UPS modules 920 may have internal batteries, and the power interconnect assembly 930 may include bus bar connections to support provision of DC busses therein, such that the batteries of the UPS modules 930 may be parallel interconnected in a manner similar to the power input and output connections shown in FIG. 9. The power interconnect assembly 930 (or an additional, similar power interconnect assembly mounted, for example, in parallel with the power interconnect assembly 930) may be configured to support an external battery connection, similar to the AC input 950 shown in FIG. 9. Such an external battery connection may be used, for example, to connect to an external battery that serves the UPS modules 920. It will be appreciated that such an external DC connection may be used for UPS modules that do not have internal batteries, or to supplement battery power for UPS modules that do include internal batteries.

It will be further understood that a configuration along the lines described with reference to FIG. 9 may be used with other types of UPS system component modules. For example, in some embodiments of the present invention, a battery rack may have a modular construction similar to that shown for the UPS modules 920 of FIG. 9, wherein, instead of a column of UPS modules 920, a rack includes a columnar arrangement of battery modules that are interconnected by a power interconnect assembly having a form factor similar to the power interconnect assembly 930. In other embodiments, UPS modules and battery modules may be arranged together in a single rack in a similar manner, and interconnected using a power interconnect assembly having a form factor similar to the power interconnect assembly 930. Such a rack may further include other types of modules, such as transformer or switch modules that may be similarly interconnected.

Figure 10:
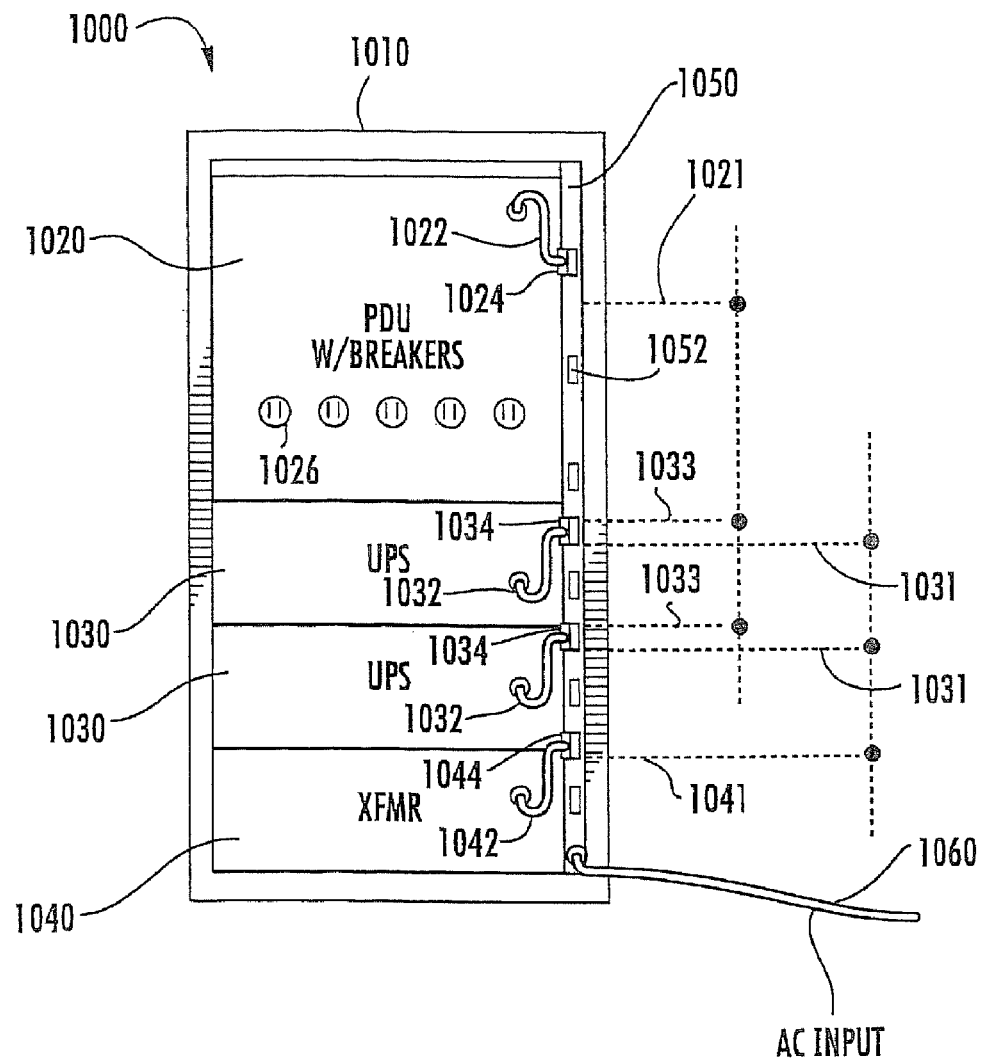
FIG. 10 illustrates a UPS system including a variety of UPS system component modules according to further embodiments of the present invention.

In further embodiments, a similar approach may be used to interconnect other types of UPS system component modules in a single equipment rack. In particular, FIG. 10 illustrates another exemplary UPS system 1000 according to further embodiments of the present invention wherein two UPS modules 1030, a transformer (xfmr) module 1040 and a power distribution unit (PDU) module 1020 are arranged in a columnar fashion in an equipment rack 1010. The modules 1020, 1030, 1040 have respective power cables 1022, 1032, 1042 extending therefrom and terminating in respective connectors 1024, 1034, 1044.

An elongate power interconnect assembly 1050 is mounted vertically in the equipment rack 1010, extending along the column of modules 1020, 1030, 1040. The power interconnect assembly 1050 includes a plurality of connectors 1052 spaced along a face thereof. As shown in dashed line, the power interconnect assembly 1050 provides parallel connection of power inputs 1031 of the UPS modules 1030 with a power output 1041 of the transformer module 1040, e.g., by common connection to a bus bar(s) the power interconnect assembly 1050. The power interconnect assembly 1050 also supports parallel interconnection of power outputs 1033 of the UPS modules 1030 with a power input 1021 of the power distribution module 1020. The transformer module 1040 may be fed from an AC input 1060 to the power interconnect assembly 1050.

It will be understood that the configuration of modules shown in FIG. 10 is an illustrative example, and that other embodiments of the present invention may include other collections and arrangements of UPS system component modules. For example, a multi-module arrangement such as that shown in FIG. 10 could include modules, such as bypass switch and battery modules, in addition to the UPS, transformer and PDU modules shown. Interconnection among these modules may be provided using one or more pluggable power interconnect assemblies similar to the power interconnect assembly 1050 shown in FIG. 10.

Figure 11:
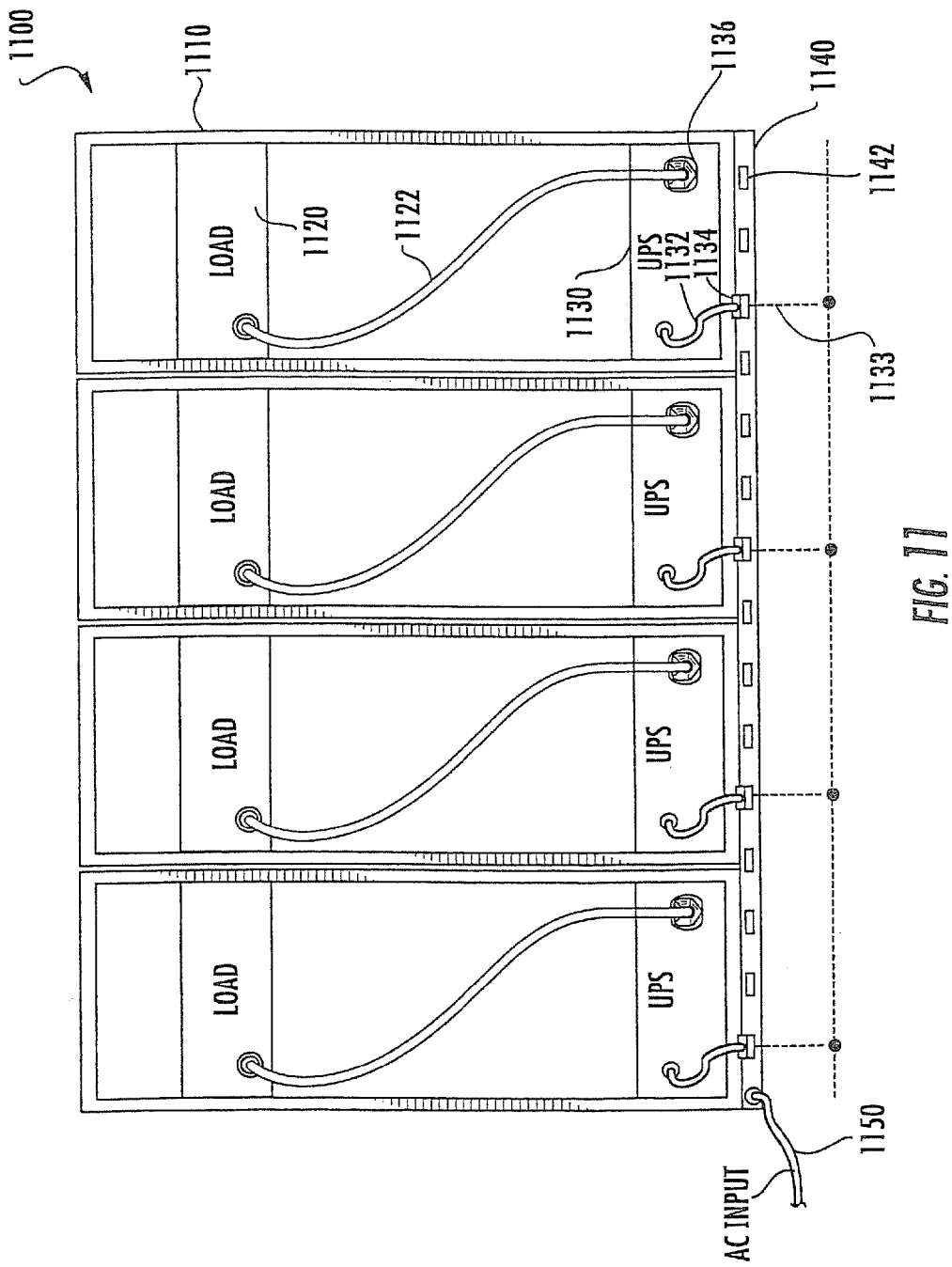
FIG. 11 illustrates an electronic system incorporating UPS system component modules in a row of equipment racks according to additional embodiments of the present invention.

According to further embodiments of the present invention, a power interconnect assembly along the lines discussed above may also support a horizontal arrangement in a row of equipment racks. Referring to FIG. 11, a system 1100 according to some embodiments of the present invention includes a plurality of UPS modules 1130 that are arranged in a horizontal row in a row of equipment racks 1110. An elongate power interconnect assembly 1140 is attached to the plurality of equipment racks 1110. As shown, the power interconnect assembly 1140 may be attached along bottom rear faces of the racks 1110 using, for example, clamps, mounting brackets or other mountings. It will be appreciated, however, that the power interconnect assembly 1140 may be mounted in other locations, for example, along top portions of the back faces of the racks 1110 and/or on top of the racks 1110.

The power interconnect assembly 1140 may provide parallel interconnection of the UPS modules 1130. As shown, for example, power outputs 1133 of the UPS modules 1130 may be connected in parallel, e.g., using common connection to a bus bar(s), by the power interconnect assembly 1140 when connectors 1134 of power cables 1132 of the UPS modules 1130 are pluggably mated with connectors 1142 of the power interconnect assembly 1140. Power outlets 1136 of the UPS modules 1130 are electrically connected to the power inputs 1133 and are configured to serve loads 1120, which are also positioned in the equipment racks 1110 via cables 1122. For example, in IT applications, the loads 1120 may include server, router, hub or the computer or data processing and/or communications modules that are powered by the UPS modules 1130. Connections between the loads 1120 and the UPS modules 1130 may be direct, as shown in FIG. 11, and/or may use power strips or other intermediate distribution devices mounted in and/or on the equipment racks 1110. Power inputs of the UPS modules 1130 may also be parallel connected using the power interconnect assembly 1140 (or a similar separate power interconnect assembly), which receives AC power from an AC input 1150. The power interconnect assembly 1140 (or an additional power interconnect assembly) may also support battery interconnection.

Figure 12:
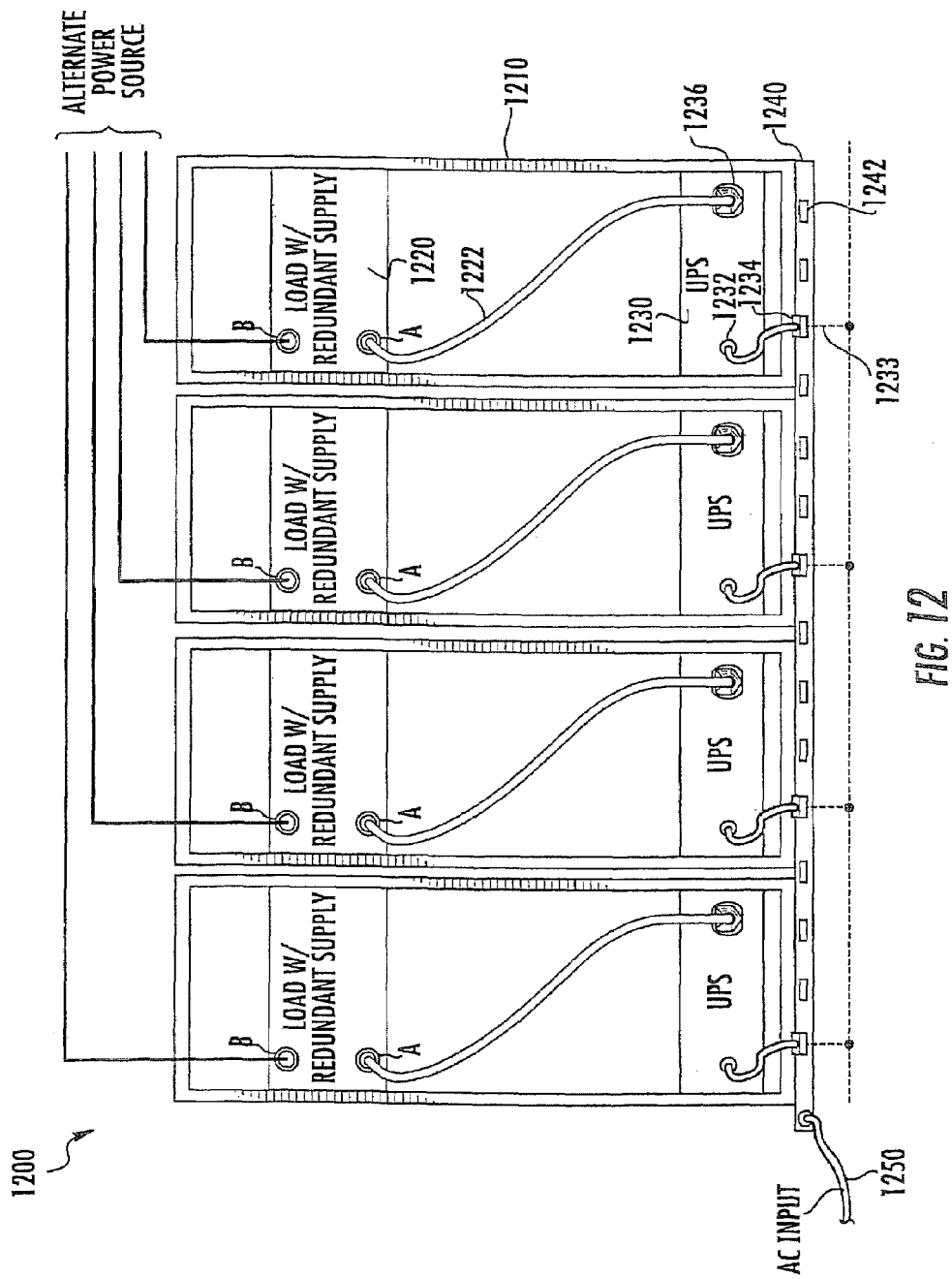
FIGS. 12 and 13 illustrates electronic systems in which modular arrangements of UPS system component modules are configured to supply loads with redundant power inputs.

Some IT applications, such as server rack applications, may involve providing power to rack-mounted loads that are served by redundant power supplies. For example, referring to FIG. 12, which illustrates a system 1200 according to further embodiments of the present invention, loads 1220 arranged in equipment racks 1210 may include first and second power inputs A, B, which feed, for example, redundant DC power supplies of the loads 1220. A row of UPS modules 1230 may be arranged in the racks 1210 in a manner similar to that described above with reference to FIG. 11. In particular, by pluggably mating connectors 1234 of power cables 1232 of the UPS modules 1230 with connectors 1242 of a power interconnect assembly 1240 extending along the row of UPS modules 1230, power outputs 1233 of the UPS modules 1230 may be paralleled via the interconnect assembly 1240. Power outlets 1236 of the UPS modules 1230 are electrically coupled to the power outputs 1233, and to the first power inputs A of the loads 1220 via power cables 1222, thus providing a first power source for the loads 1220. An alternative power source may be coupled to the second power inputs B of the loads 1220. Connections between the loads 1220 and the UPS modules 1230 may be direct and/or may use power strips or other intermediate distribution devices mounted in and/or on the equipment racks 1210. Power inputs of the UPS modules 1230 may also be parallel connected using the power interconnect assembly 1240 (or a similar separate power interconnect assembly), which receives AC power from an AC input 1250. The power interconnect assembly 1240 (or an additional power interconnect assembly) may also support battery interconnection.

Figure 13:
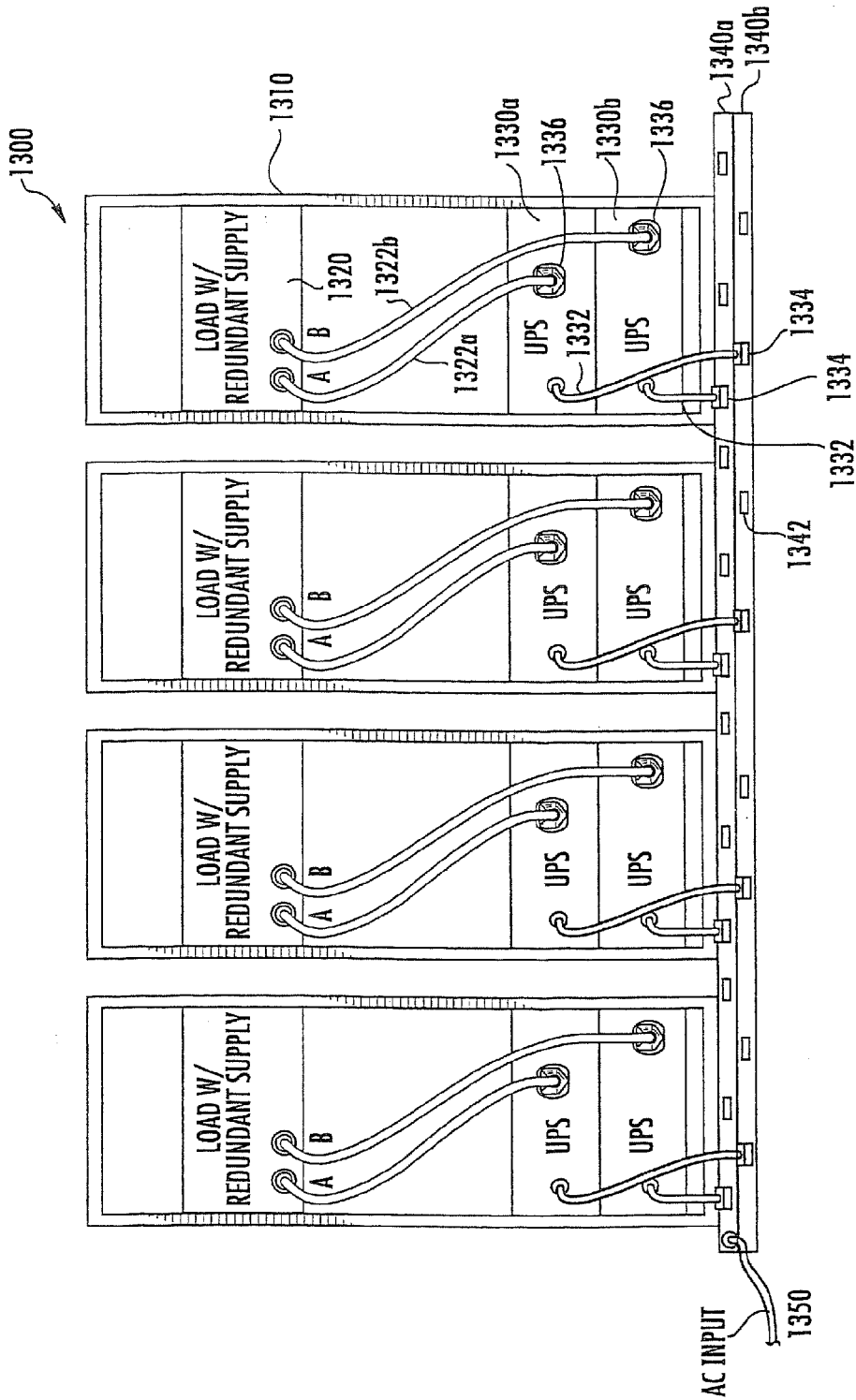

FIG. 13 illustrates an exemplary arrangement for providing power to loads with redundant power inputs. In a system 1300, first and second rows of UPS modules 1330*a*, 1330*b* are arranged in a row of equipment racks 1310, which also house loads 1320 that have redundant first and second power inputs A, B. Connectors 1334 of power output cables 1332 of respective ones of the rows of UPS modules 1330*a*, 1330*b* are pluggably mated with connectors 1342 of respective power interconnect assemblies 1340*a*, 1340*b*. The power interconnect assemblies 1340*a*, 1340*b* provide parallel output interconnections among the UPS modules 1330*a*, 1330*b* of the rows of UPS modules, e.g., along the lines described above with reference to FIG. 12. First power input cables 1322*a* of the loads 1320 are connected to power outlets 1336 of the first row of UPS modules 1330*a*, while second power input cables 1332 of the loads 1320 are connected to power outlets 1336 of the second row of UPS modules 1330*b*. Connections between the loads 1320 and the UPS modules 1330*a*, 1330*b* may be direct and/or may use power strips or other intermediate distribution devices mounted in and/or on the equipment racks 1310. Power inputs of the UPS modules 1330*a*, 1330*b* may also be parallel connected using the power interconnect assemblies 1340*a*, 1340*b* (or a similar separate power interconnect assembly), which may receive one or more AC inputs 1350 (e.g., the assemblies 1340*a*, 1340*b* may be fed from the same power source or from separate power sources). The power interconnect assemblies 1340*a*, 1340*b* (or an additional power interconnect assembly) may also support battery interconnection.

It will be understood that the above-described systems and methods are illustrative examples, and that other arrangements and/or combinations of components fall within the scope of the present invention. For example, systems such as those illustrated in FIGS. 12 and 13 may further include additional other types of UPS system component modules, such as battery, switch, and transformer modules.

In the drawings and specification, there have been disclosed exemplary embodiments of the invention. Although specific terms are employed, they are used in a generic and descriptive sense only and not for purposes of limitation, the scope of the invention being defined by the following claims.

The invention claimed is:

1. A power interconnect assembly, comprising:
a longitudinally extending base member including a plurality of longitudinally extending receiving channels;
a plurality of longitudinally extending bus bars positioned in respective ones of the receiving channels;
an interconnect module coupled to the base member, wherein the interconnect module includes a connector member that is configured to receive a pluggable connectorized cable from a power component;
a plurality of linking electrical connection members coupling ones of a plurality of electrical connectors of the connector member to corresponding ones of the plurality of bus bars, wherein the linking electrical connection members are configured to selectably couple the electrical connectors of the connector member to designated ones of the plurality of bus bars to define a connection arrangement between the connector member and the bus bars.

2. The power interconnect assembly of claim 1, wherein any of the electrical connectors of the connector member may be selectably coupled to any of the bus bars.

3. A power interconnect assembly comprising:
a longitudinally extending base member including a plurality of longitudinally extending receiving channels;
a plurality of longitudinally extending bus bars positioned in respective ones of the receiving channels;
an interconnect module coupled to the base member, wherein the interconnect module includes a connector member that is configured to receive a pluggable connectorized cable from a power component;
a plurality of linking electrical connection members coupling ones of a plurality of electrical connectors of the connector member to corresponding ones of the plurality of bus bars, wherein the linking electrical connection members are configured to selectable couple the electrical connectors of the connector member to designated ones of the plurality of bus bars to define a connection arrangement between the connector member and the bus bars; and
a second interconnect module coupled to the base member at a position longitudinally displaced from the first interconnect module and wherein a connection arrangement between a connector member of the second interconnect module and the bus bars differs from the connection arrangement of the connector member of the first interconnect member and wherein the connector member of the second interconnect member has a same form factor as the connector member of the first interconnect member.

4. The power interconnect assembly of claim 3, wherein the first and the second interconnect modules are coupled to the base member at selectable longitudinal locations on the base member and wherein the linking electrical connection members couple the connector members to the bus bars at locations proximate the respective longitudinal locations.

5. The power interconnect assembly of claim 4, wherein the channels each include openings exposing bus bars positioned therein to allow coupling of the bus bars to the interconnect members proximate the interconnect members at a plurality of longitudinal locations.

6. The power interconnect assembly of claim 5, wherein the base member includes a longitudinally extending interconnect module receiving portion configured to receive a plurality of longitudinally spaced interconnect modules and wherein the openings in the channels comprise longitudinally extending openings in the channels extending throughout the interconnect module receiving portion and wherein the longitudinally extending openings allow connection of the electrical connection members to the bus bars at any location in the interconnect module receiving portion.

7. The power interconnect assembly of claim 4, further comprising a spacer member coupled to the base member and extending longitudinally between and abutting the first and second interconnect modules.

8. The power interconnect assembly of claim 7, wherein the interconnect modules and spacer member extend from a first end of the base member to a second end of the base member around the bus bars to define a cavity enclosing the bus bars.

9. The power interconnect assembly of claim 4, wherein the base member further comprises a termination section at an end thereof including input connectors coupled to respective ones of the bus bars.

10. The power interconnect assembly of claim 4, wherein the base member includes a longitudinally extending interconnect module receiving member including a longitudinally extending mounting channel on a face thereof and wherein the interconnect modules are mounted to the base member by screw members received in and engaging the mounting channel.

11. The power interconnect assembly of claim 10 wherein the base member includes a longitudinally extending interconnect module receiving portion configured to receive a plurality of longitudinally spaced interconnect modules and wherein the mounting channel extends through the interconnect module receiving portion to allow the interconnect modules to be mounted at the selectable longitudinal locations.

12. The power interconnect assembly of claim 11, wherein the base member comprises:
a rack mounting wall portion having interconnect module receiving channels on first and second ends thereof configured to receive ends of interconnect modules coupled to the base member; and
a bus bar receiving portion, including the bus bar receiving channels, extending from the rack mounting wall portion and having an end portion displaced from the rack mounting wall portion including the mounting channel therein to define the interconnect module receiving member.

13. The power interconnect assembly of claim 12, wherein the base member comprises an extruded polymeric member comprising polystyrene and/or polyphenylene ether.

14. The power interconnect assembly of claim 12 wherein the interconnect modules each comprise:
a first L-shaped member extending from a first end positioned in a first of the receiving channels of the rack mounting wall portion to a second end adjacent the interconnect module receiving member and extending over the mounting channel;
a second L-shaped member extending from a first end positioned in the other of the receiving channels of the rack mounting wall portion to a second end adjacent the interconnect module receiving member and extending over the mounting channel with the first L-shaped member therebetween; and
a connector receiving opening over the mounting channel defined by the overlapping first and second L-shaped members and configured to receive the connector member.

15. The power interconnect assembly of claim 14, wherein the first and second L-shaped members comprise polystyrene and/or polyphenylene ether.

16. The power interconnect assembly of claim 14, further comprising a self-tapping screw extending through the first and second L-shaped members and into the mounting channel to couple the first and second L-shaped members to the base member.

17. The power interconnect assembly of claim 3, wherein the first connector member has a first keying arrangement and the second connector member has a second keying arrangement different from the first keying arrangement so that the first connector member will block insertion of a pluggable connectorized cable keyed to the second connector member and the second connector member will block insertion of a pluggable connectorized cable keyed to the first connector member.

18. The power interconnect assembly of claim 3, wherein the form factor comprises a finger proof connector.

19. A power assembly including the power interconnect assembly of claim 4 mounted in a rack and further including a plurality of power components therein coupled to respective interconnect modules of the power interconnect assembly.

20. The power assembly of claim 19, wherein the power interconnect assembly includes an interconnect module associated with each of the plurality of power components and having an associated longitudinal location on the base member and an associated connection arrangement selected for the respective power component.

21. A power interconnect assembly, comprising:
a longitudinally extending base member including a plurality of longitudinally extending receiving channels;
a plurality of longitudinally extending bus bars positioned in respective ones of the receiving channels;
an interconnect module coupled to the base member, wherein the interconnect module includes a connector member that is configured to receive a pluggable connectorized cable from a power component;
a plurality of linking electrical connection members coupling ones of a plurality of electrical connectors of the connector member to corresponding ones of the plurality of bus bars, wherein the linking electrical connection members are configured to selectably couple the electrical connectors of the connector member to designated ones of the plurality of bus bars to define a connection arrangement between the connector member and the bus bars; and
wherein the interconnect module includes a plurality of connector members therein and wherein a connection arrangement between ones of the connector members and the bus bars differs for respective ones of the connector members and wherein the connector members have a same form factor as the connector member of the first interconnect member.

22. The power interconnect assembly of claim 21, wherein the form factor comprises a finger proof connector.

23. A power interconnect assembly, comprising:
a longitudinally extending base member including a plurality of longitudinally extending bus bar receiving channels configured to receive longitudinally extending bus bars;
an interconnect module configured to be coupled to the base member, wherein the interconnect module is configured to receive a connector member that is configured to receive a pluggable connectorized cable from a power component; and
wherein the base member is configured so that ones of a plurality of electrical connectors of the connector member may be selectably coupled to designated ones of the bus bars with the bus bars inserted in the channels to define one of a plurality of connection arrangements as a connection arrangement for the connector member.

24. The power interconnect assembly of claim 23, wherein the channels each include openings for exposing bus bars positioned therein to allow coupling of the bus bars to the connector member at a plurality of longitudinal locations.

25. The power interconnect assembly of claim 24, wherein the base member includes a longitudinally extending interconnect module receiving portion configured to receive a plurality of longitudinally spaced interconnect modules having connector members and wherein the openings in the channels comprise longitudinally extending openings in the channels extending throughout the interconnect module receiving portion and wherein the longitudinally extending openings allow connection of the connector members to the bus bars at any location in the interconnect module receiving portion.

26. The power interconnect assembly of claim 25, wherein the interconnect modules extend from a first end of the base member to a second end of the base member around the bus bar receiving channels to define a cavity enclosing the bus bars.

27. The power interconnect assembly of claim 23, wherein any of the electrical connectors of the connector member may be selectably coupled to any of the bus bars.

28. A power interconnect assembly, comprising:
a longitudinally extending base member including a plurality of longitudinally extending bus bar receiving channels configured to receive longitudinally extending bus bars; and
an interconnect module configured to be coupled to the base member, wherein the interconnect module is configured to receive a connector member that is configured to receive a pluggable connectorized cable from a power component;
wherein the base member is configured so that ones of a plurality of electrical connectors of the connector member may be coupled to corresponding ones of the bus bars with the bus bars inserted in the channels;
wherein the channels each include openings for exposing bus bars positioned therein to allow coupling of the bus bars to the connector member at a plurality of longitudinal locations;
wherein the base member includes a longitudinally extending interconnect module receiving portion configured to receive a plurality of longitudinally spaced interconnect modules having connector members and wherein the openings in the channels comprise longitudinally extending openings in the channels extending throughout the interconnect module receiving portion and wherein the longitudinally extending openings allow connection of the connector members to the bus bars at any location in the interconnect module receiving portion; and
wherein the base member includes a longitudinally extending interconnect module receiving member including a longitudinally extending mounting channel on a face thereof and wherein the mounting channel is configured to allow the interconnect modules to be mounted to the base member by screw members received in and engaging the mounting channel.

29. The power interconnect assembly of claim 28 wherein the mounting channel extends through the interconnect module receiving portion to allow the interconnect modules to be mounted at selectable longitudinal locations.

30. The power interconnect assembly of claim 29, wherein the base member comprises:
a rack mounting wall portion having interconnect module receiving channels on first and second ends thereof configured to receive ends of interconnect modules coupled to the base member; and
a bus bar receiving portion, including the bus bar receiving channels, extending from the rack mounting wall portion and having an end portion displaced from the rack mounting wall portion including the mounting channel therein to define the interconnect module receiving member.

31. The power interconnect assembly of claim 30, wherein the base member comprises an extruded polymeric member comprising polystyrene and/or polyphenylene ether.

32. A power interconnect assembly, comprising:
a longitudinally extending base member including a plurality of longitudinally extending bus bar receiving channels configured to receive longitudinally extending bus bars; and
an interconnect module configured to be coupled to the base member, wherein the interconnect module is configured to receive a connector member that is configured to receive a pluggable connectorized cable from a power component;
wherein the base member is configured so that ones of a plurality of electrical connectors of the connector member may be coupled to corresponding ones of the bus bars with the bus bars inserted in the channels;
wherein the channels each include openings for exposing bus bars positioned therein to allow coupling of the bus bars to the connector member at a plurality of longitudinal locations;
wherein the base member includes a longitudinally extending interconnect module receiving portion configured to receive a plurality of longitudinally spaced interconnect modules having connector members and wherein the openings in the channels comprise longitudinally extending openings in the channels extending throughout the interconnect module receiving portion and wherein the longitudinally extending openings allow connection of the connector members to the bus bars at any location in the interconnect module receiving portion; and
wherein the connector members have a same form factor.

33. The power interconnect assembly of claim 32, wherein the form factor comprises a finger proof connector.

34. A method of configuring a power interconnect assembly for use in a power supply having associated electrical bus connections, comprising:
identifying a plurality of power components of the power supply;
determining a connection arrangement for each of the plurality of power components to the electrical bus connections;
providing a longitudinally extending base member including a plurality of bus bars therein corresponding to respective ones of the electrical bus connections;
providing a plurality of connector members, each of the connector members being configured to receive a pluggable connectorized cable from a power component and having a plurality of electrical connectors at defined positions therein;
electrically connecting ones of the plurality of electrical connectors of ones of the plurality of connectors to corresponding ones of the bus bars based on the determined connection arrangement of respective ones of the power components to be associated with the connector members; and
coupling an interconnect module to the base member and covering the bus bars for each of the plurality of power components with its associated connector member positioned therein to provide a configured power interconnect assembly.

35. The method of claim 34, further comprising determining a longitudinal location associated with each of the plurality of power components and wherein coupling the interconnect module includes coupling the interconnect module having the connector associated with a respective power component to the base member at the determined longitudinal location for the associated power component for each of the power components.

36. The method of claim 35, further comprising:
mounting the configured power interconnect assembly to a rack of the power supply;

positioning the plurality of power components in the rack; and coupling respective ones of the power components to their associated connector members in the power interconnect assembly using pluggable connectorized cables extending from the respective ones of the power components.

* * * * *

UNITED STATES PATENT AND TRADEMARK OFFICE
CERTIFICATE OF CORRECTION

PATENT NO.        : 7,252,524 B1
APPLICATION NO. : 11/378139
DATED             : August 7, 2007
INVENTOR(S)       : Johnson, Jr. et al.

It is certified that error appears in the above-identified patent and that said Letters Patent is hereby corrected as shown below:

In The Claims

Column 16, Claim 3, Line 22: Please correct "selectable"
                             To read -- selectably--

Signed and Sealed this

Sixth Day of November, 2007

JON W. DUDAS
*Director of the United States Patent and Trademark Office*